(12) United States Patent
Chun et al.

(10) Patent No.: US 9,287,415 B2
(45) Date of Patent: Mar. 15, 2016

(54) SCHOTTKY BARRIER DIODE AND METHOD OF MANUFACTURING THE SAME

(71) Applicant: Hyundai Motor Company, Seoul (KR)

(72) Inventors: Dae Hwan Chun, Gyeonggi-Do (KR); Kyoung-Kook Hong, Gyeonggi-Do (KR); Jong Seok Lee, Gyeonggi-Do (KR); Junghee Park, Gyeonggi-Do (KR); Youngkyun Jung, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/468,987

(22) Filed: Aug. 26, 2014

(65) Prior Publication Data

US 2015/0187962 A1   Jul. 2, 2015

(30) Foreign Application Priority Data

Dec. 30, 2013 (KR) .................. 10-2013-0167807

(51) Int. Cl.
| | | |
|---|---|---|
| H01L 51/40 | (2006.01) | |
| H01L 29/872 | (2006.01) | |
| H01L 21/04 | (2006.01) | |
| H01L 29/66 | (2006.01) | |
| H01L 29/06 | (2006.01) | |
| H01L 29/16 | (2006.01) | |

(52) U.S. Cl.
CPC ............ *H01L 29/872* (2013.01); *H01L 21/046* (2013.01); *H01L 21/0495* (2013.01); *H01L 29/0623* (2013.01); *H01L 29/6606* (2013.01); *H01L 29/1608* (2013.01)

(58) Field of Classification Search
CPC ............ H01L 21/0435; H01L 21/0495; H01L 21/28537; H01L 21/28581; H01L 27/0766; H01L 29/0615–29/0646; H01L 29/47; H01L 29/66143; H01L 29/66212; H01L 29/7806; H01L 29/782; H01L 29/872; H01L 31/1085; H01L 33/00332

See application file for complete search history.

(56) References Cited

U.S. PATENT DOCUMENTS

| | | | | |
|---|---|---|---|---|
| 7,863,682 | B2 * | 1/2011 | Okuno | ............... H01L 29/0692 257/339 |
| 2008/0001159 | A1 * | 1/2008 | Ota | ...................... H01L 29/872 257/77 |
| 2014/0077225 | A1 | 3/2014 | Lee et al. | |

FOREIGN PATENT DOCUMENTS

| | | |
|---|---|---|
| JP | 2002-314099 A | 10/2002 |
| JP | 2012-094683 A | 5/2012 |

(Continued)

OTHER PUBLICATIONS

Chien, et al., "A Novel High Channel Density Trench Power MOSFETs Design" by Asymmetric Wing-cell Structure, Feng-Chia University and National Central University, Department of Electrical Engineering.

*Primary Examiner* — David Vu
*Assistant Examiner* — Cuong Nguyen
(74) *Attorney, Agent, or Firm* — Mntz Levin Cohn Ferris Glovsky and Popeo, P.C.; Peter F. Corless

(57) ABSTRACT

A Schottky barrier diode includes: an n− type epitaxial layer disposed on a first surface of an n+ type silicon carbide substrate; a first p+ region disposed on the n− type epitaxial layer; an n type epitaxial layer disposed on the n− type epitaxial layer and the first p+ region; a second p+ region disposed on the n type epitaxial layer, and being in contact with the first p+ region; a Schottky electrode disposed on the n type epitaxial layer and the second p+ region; and an ohmic electrode disposed on a second surface of the n+ type silicon carbide substrate. Also, the first p+ region has a lattice shape including a plurality of vertical portions and horizontal portions connecting both ends of the respective vertical portions to each other.

16 Claims, 9 Drawing Sheets

(56) References Cited

FOREIGN PATENT DOCUMENTS

| | | |
|---|---|---|
| JP | 2013-149974 A | 8/2013 |
| KR | 10-2008-0078290 | 8/2008 |
| KR | 10-2014-0035594 | 3/2014 |

* cited by examiner

SCHOTTKY BARRIER DIODE AND METHOD OF MANUFACTURING THE SAME

CROSS-REFERENCE TO RELATED APPLICATION

This application claims under 35 U.S.C. §119(a) priority to and the benefit of Korean Patent Application No. 10-2013-0167807 filed in the Korean Intellectual Property Office on Dec. 30, 2013, the entire contents of which are incorporated herein by reference.

BACKGROUND (a) Field of the Invention

The present invention relates to a Schottky barrier diode including silicon carbide (SiC), and a method of manufacturing the same.

(b) Description of the Related Art

A Schottky barrier diode (SBD) uses a Schottky junction in which a metal and a semiconductor are joined. The SBD, unlike a general PN diode, exhibits a rapid switching characteristic, and has a lower turn-on voltage characteristic than that of the PN diode.

Generally, in a Schottky barrier diode, a structure of a junction barrier Schottky (JBS), in which a p+ region is formed at a lower end of a Schottky junction portion, is applied in order to improve a characteristic of leak current reduction, thereby obtaining an effect of blocking the leak current and improving a breakdown voltage by overlapping of PN diode depletion layers diffused when a reverse voltage is applied.

However, since the p+ region exists in the Schottky junction portion, a contact area of a Schottky electrode and an n− drift layer, which serves as a current path in a forward direction, is decreased, so that there is a problem in that a resistance value is increased, and on-resistance of the Schottky barrier diode is increased. Further, since the p+ region floats, a width of the depletion layer blocking the leak current is not large, and thus, there is difficulty during a process of reducing an interval between the p+ regions.

The above information disclosed in this Background section is only for enhancement of understanding of the background of the invention and therefore it may contain information that does not form the prior art that is already known in this country to a person of ordinary skill in the art.

SUMMARY

The present invention is directed to a Schottky barrier diode of which on-resistance is decreased when a voltage in a forward direction is applied.

An exemplary embodiment of the present invention provides a Schottky barrier diode, including: an n− type epitaxial layer disposed on a first surface of an n+ type silicon carbide substrate; a first p+ region disposed on the n− type epitaxial layer; an n type epitaxial layer disposed on the n− type epitaxial layer and the first p+ region; a second p+ region disposed on the n type epitaxial layer, and being in contact with the first p+ region; a Schottky electrode disposed on the n type epitaxial layer and the second p+ region; and an ohmic electrode disposed on a second surface of the n+ silicon carbide substrate, in which the first p+ region has a lattice shape including a plurality of vertical portions and horizontal portions connecting both ends of the respective vertical portions to each other, the vertical portions include a plurality of first portions shaped like a hexagon, a plurality of second portions connecting the respective first portions, and a plurality of third portions connecting the first portions and the horizontal portions, and each second portion and each third portion are shaped like a rod.

Each of the first portions may have a regular hexagonal shape.

A width of each first portion may be larger than a width of each second portion.

The width of each second portion may be the same as a width of each third portion.

A horizontal line passing a center point of the first portion may not meet a horizontal line passing a center point of the first portion of the adjacent vertical portion.

The second p+ region may have a quadrangular shape.

The second p+ region may be in contact with the horizontal portion and the vertical portions positioned at both ends among the plurality of vertical portions.

A doping concentration of the n type epitaxial layer may be higher than a doping concentration of the n− type epitaxial layer.

Another exemplary embodiment of the present invention provides a method of manufacturing a Schottky bather diode, including: forming an n− type epitaxial layer on a first surface of an n+ type silicon carbide substrate; injecting p+ ions into a surface of the n− type epitaxial layer to form a first p+ region; forming an n type epitaxial layer on the n− epitaxial layer and the first p+ region; injecting p+ ions into a surface of the n type epitaxial layer to form a second p+ region that is in contact with the first p+ region; forming a Schottky electrode on the n type epitaxial layer and the second p+ region; and forming an ohmic electrode on a second surface of the n+ type silicon carbide substrate, in which the first p+ region has a lattice shape including a plurality of vertical portions and horizontal portions connecting both ends of the respective vertical portions to each other, the vertical portions include a plurality of first portions shaped like a hexagon, a plurality of second portions connecting the respective first portions, and a plurality of third portions connecting the first portions and the horizontal portions, and each second portion and each third portion are shaped like a rod.

According to the exemplary embodiments of the present invention, the p+ region positioned in a lower layer among the p+ regions of the double layers is shaped like a lattice including the vertical portions and the horizontal portions, and each vertical portion includes each first portion shaped like a hexagon to increase an area of the n− type epitaxial layer, thereby increasing a current quantity when a voltage in a forward direction is applied.

Further, a doping concentration of the n type epitaxial layer that is in contact with the Schottky electrode is formed to be higher than a doping concentration of the n− type epitaxial layer positioned under the n type epitaxial layer to reduce resistance of the Schottky barrier diode, thereby increasing increase a current quantity when a voltage in the forward direction is applied.

Further, an area of Schottky junction is maximized, thereby reducing on-resistance when a voltage in the forward direction is applied.

DETAILED DESCRIPTION OF THE EMBODIMENTS

Figure 1:
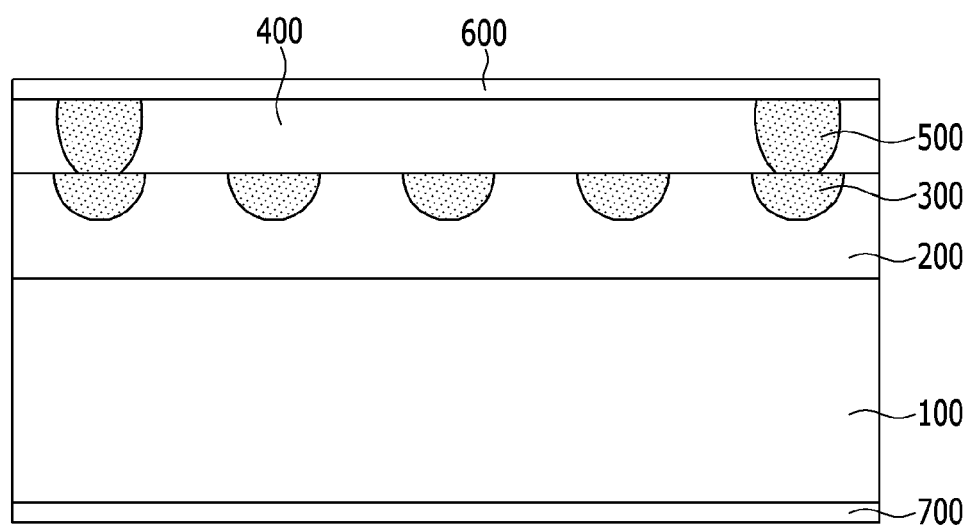
FIG. 1 is a cross-sectional view illustrating a Schottky barrier diode according to an exemplary embodiment of the present invention.

Exemplary embodiments of the present invention will be described in detail with reference to the accompanying drawings. As those skilled in the art would realize, the described embodiments may be modified in various different ways, all without departing from the spirit or scope of the present invention. The exemplary embodiments that are disclosed herein are provided so that the disclosed contents may become thorough and complete and the spirit of the present invention may be sufficiently understood to a person of an ordinary skill in the art.

In the drawings, the thickness of layers and regions are exaggerated for clarity. In addition, in the case when it is mentioned that a layer is present "on" the other layer or a substrate, the layer may be directly formed on the other layer or the substrate or a third layer may be interposed therebetween. Like reference numerals designate like constituent elements throughout the specification.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 2:
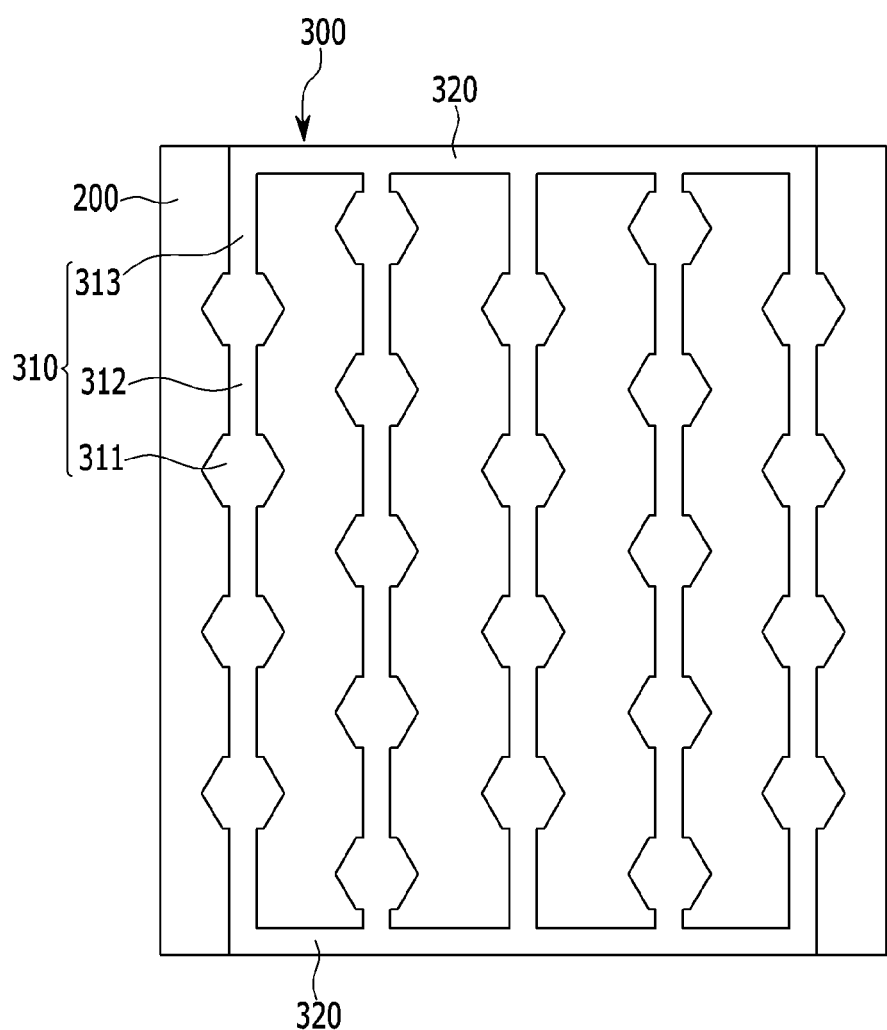
FIG. 2 is a plan view illustrating an n− type epitaxial layer of FIG. 1.
Figure 3:
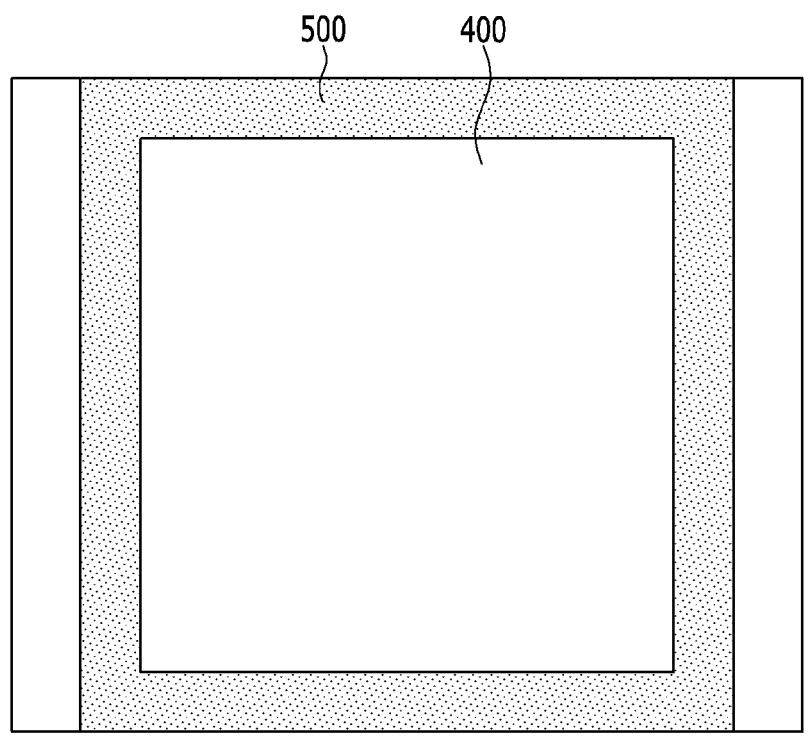
FIG. 3 is a plan view illustrating an n type epitaxial layer of FIG. 1.

FIG. 1 is a cross-sectional view illustrating a Schottky barrier diode according to an exemplary embodiment of the present invention, FIG. 2 is a plan view illustrating an n− type epitaxial layer of FIG. 1, and FIG. 3 is a plan view illustrating an n type epitaxial layer of FIG. 1.

Referring to FIGS. 1 to 3, in the Schottky bather diode according to the exemplary embodiment of the present invention, an n− type epitaxial layer 200, an n type epitaxial layer 400, and a Schottky electrode 600 are sequentially disposed on a first surface of an n+ type silicon carbide substrate 100, and an ohmic electrode 700 is disposed on a second surface of the n+ type silicon carbide substrate 100. A doping concentration of the n type epitaxial layer 400 is higher than a doping concentration of the n− type epitaxial layer 200.

A first p+ region 300, into which p+ ions are injected, is disposed in the n− type epitaxial layer 200, and a second p+ region 500, into which p+ ions are injected, is disposed in the n type epitaxial layer 400. The p+ ions injected into the first p+ region 300 and the second p+ region 500 may be the same or be different. In particular, the Schottky electrode 600 is in contact with the n type epitaxial layer 400 and the second p+ region 500.

The first p+ region 300 is disposed in a lattice shape on a surface of the n− type epitaxial layer 200. The first p+ region 300 includes a plurality of vertical portions 310, and horizontal portions 320 connecting both ends of the respective vertical portions 310.

The vertical portions 310 include a plurality of first portions 311 having a hexagonal shape, a plurality of second portions 312 connecting the respective first portions 311, and a plurality of third portions 313 connecting the first portions 311 and the horizontal portions 320. Each of the first portions 311 may be shaped like a hexagon, preferably, a regular hexagon, and a width of each first portion 311 is larger than a width of each second portion 312. The second portions 312 and the third portions 313 each are shaped like a rod, and widths thereof are the same as each other.

In the two vertical portions 310 which are adjacent to each other, the first portions 311 are disposed in a zigzag form so that a horizontal line passing a center point of the first portion 311 does not meet a horizontal line passing a center point of the first portion 311 positioned in the adjacent vertical portion 310.

The second p+ region 500 is disposed in a quadrangular shape on a surface of the n type epitaxial layer 400, and is in contact with the first p+ region 300. The second p+ region 500 is in contact with the horizontal portions 320 of the first p+ region 300 and the vertical portions 310 positioned at both ends among the plurality of vertical portions 310. The first p+ region 300 and the second p+ region 500 receive a minus voltage when a voltage in a backward direction is applied by the contact, so that a depletion layer of a PN junction, that is a junction region of the first p+ region 300 and the n− type epitaxial layer 200, becomes wide, thereby maximally suppressing a leak current flowing in the backward direction.

Further, the plurality of first portions 311 having the hexagonal shape is disposed in the first p+ region 300, so that an area of the first p+ region 300 per unit area may be decreased compared to the first p+ region 300 having the rod shape. Accordingly, it is possible to increase an area of the n− type epitaxial layer 200, thereby increasing a current quantity when a voltage in a forward direction is applied. Further, in comparison between the Schottky barrier diode in which the first p+ region 300 including the plurality of first portions 311 shaped like the hexagon is formed and the Schottky barrier diode in which the first p+ region 300 shaped like the rod is formed, when the current quantities are the same during the application of the voltage in the forward direction, the area of the Schottky barrier diode may be decreased.

Further, the first p+ region 300 shaped like the lattice is formed on the surface of the n− type epitaxial layer 200, and the second p+ region 500 that is in contact with the first p+ region 300 is formed at an edge of the n type epitaxial layer 400, so as to increase a Schottky junction area, thereby reducing on-resistance when the voltage in the forward direction is applied.

Further, in the present exemplary embodiment, a doping concentration of the n type epitaxial layer 400 that is in contact with the Schottky electrode 600 is formed to be higher than a doping concentration of the n− type epitaxial layer 200 positioned under the n type epitaxial layer 400 to reduce resistance of the Schottky barrier diode, thereby increasing a current quantity flowing from the Schottky electrode 600 to the ohmic electrode 700.

Characteristics of the Schottky barrier diode according to the exemplary embodiment of the present invention and a Schottky bather diode according to the Comparative Example will be described with reference to FIGS. 4 and 5, and Table 1.

Figure 4:
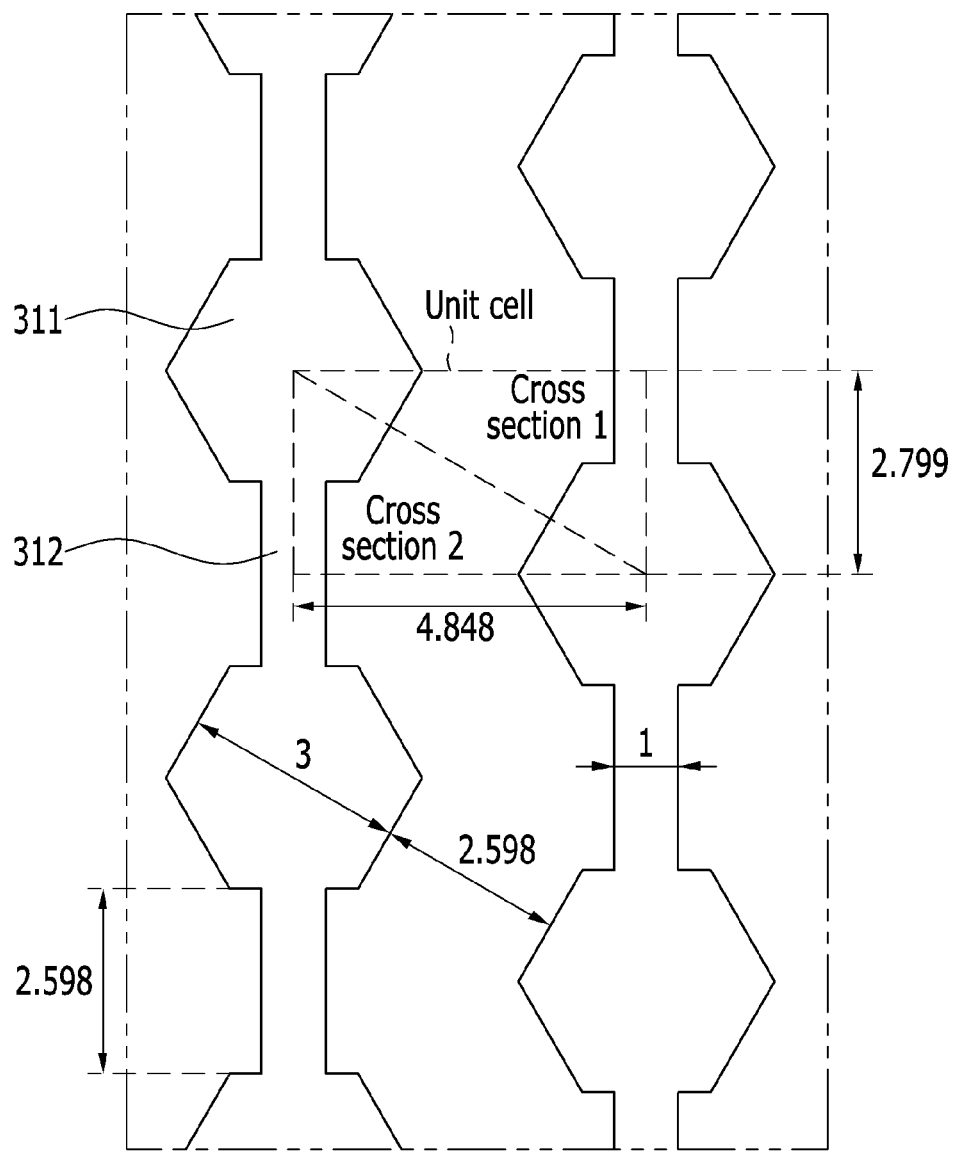
FIG. 4 is a top plan view illustrating a part of a first p+ region of the Schottky bather diode according to the exemplary embodiment of the present invention.
Figure 5:
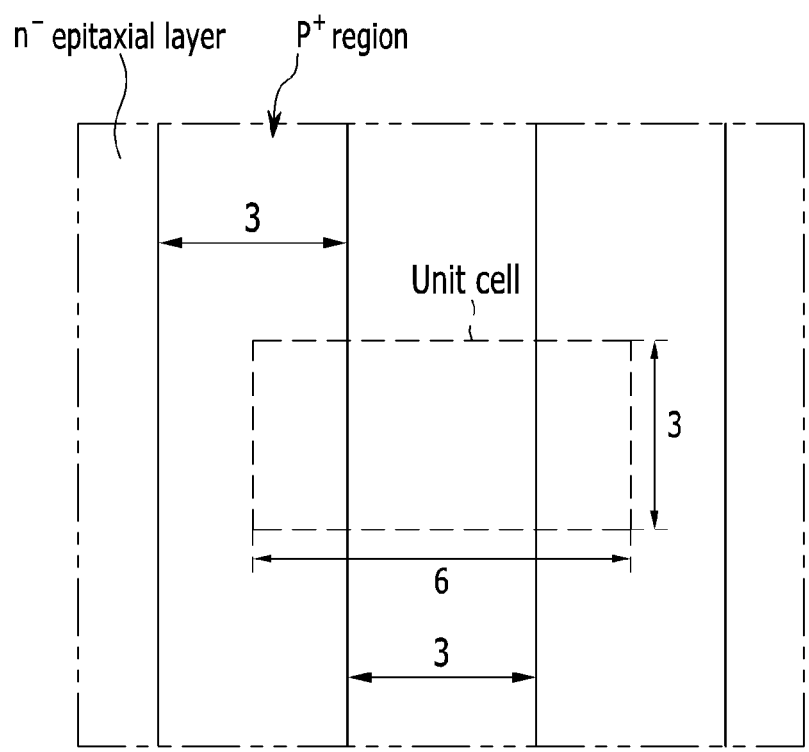
FIG. 5 is a top plan view illustrating a part of a first p+ region of a Schottky bather diode according to a Comparative Example.

The Schottky barrier diode according to the exemplary embodiment of the present invention is prepared as illustrated in FIG. 4, and a Schottky barrier diode according to a Comparative Example is prepared as illustrated in FIG. 5.

FIG. 4 is a top plan view illustrating a part of a first p+ region of the Schottky barrier diode according to the exemplary embodiment of the present invention.

Referring to FIG. 4, the first portion 311 is shaped like a regular hexagon, and lengths of facing surfaces are 3 μm. A length of the second portion 312 connecting the first portions 311 is 2.598 μm, and a width of the first portion 311 is 1 μm. In particular, a rectangle having a line connecting the center point of the first portion 311 and the center point of the adjacent first portion 311 as a diagonal line may be formed, and the rectangle is referred to as a unit cell. The unit cell according to the present exemplary embodiment is the rectangle having a size of 4.848 μm×2.799 μm. The unit cell according to the present exemplary embodiment is divided into cross section 1 and cross section 2 based on the diagonal line connecting the center point of the first portion 311 and the center point of the adjacent first portion 311.

FIG. 5 is a top plan view illustrating a part of a first p+ region of the Schottky barrier diode according to the Comparative Example.

Referring to FIG. 5, a shape of a p+ region is a rod, and a width thereof is 3 μm. A distance between the adjacent p+ regions is 3 μm. In particular, the unit cell is a rectangle having a size of 6 μm×3 μm.

Table 1 is a table representing a result of a simulation in an on-state for the Schottky barrier diode according to the exemplary embodiment of the present invention and the Schottky bather diode according to the Comparative Example.

TABLE 1

| Classification | Unit Cell area μm² | Current quantity (A) per unit cell | Current density (A/cm²) per unit cell | Area of device (cm²) @120 A |
|---|---|---|---|---|
| Comparative Example | 18 6 × 3 | 1.005e−4 | 558 | 0.215 |
| Exemplary embodiment Cross section 1 | — | 5.339e−5 | 393 | — |
| Exemplary embodiment Cross section 2 | — | 6.161e−5 | 454 | — |
| Exemplary embodiment Cross section 1 + Cross section 2 | 13.571 (4.848 × 2.799) | 1.150e−4 | 847 | 0.142 |

Referring to FIG. 1, in a case of the Schottky barrier diode according to the exemplary embodiment of the present invention, the unit cell is divided into cross section 1 and cross section 2 to perform the simulation.

It can be seen that a current density per unit cell of the Schottky barrier diode according to the exemplary embodiment of the present invention is increased by about 52% due to an increase in a current quantity per unit cell, compared to the Schottky barrier diode according to the Comparative Example. According to the increase in the current quantity per unit cell, it can be seen that on-resistance of the Schottky barrier diode according to the exemplary embodiment of the present invention is reduced compared to the Schottky barrier diode according to the Comparative Example.

Further, it can be seen that based on the same current quantity of 120 A, an area of the Schottky barrier diode according to the exemplary embodiment of the present invention is decreased by about 34% compared to an area of the Schottky barrier diode according to the Comparative Example. Accordingly, the number of the Schottky barrier diodes according to the exemplary embodiment of the present invention per unit wafer may be increased compared to the Schottky barrier diode according to the Comparative Example, thereby reducing costs.

A method of manufacturing a Schottky barrier diode according to an exemplary embodiment of the present invention will be described in detail with reference to FIGS. 6 to 9 together with FIG. 1.

FIGS. 6 to 9 are diagrams sequentially illustrating a method of manufacturing a Schottky barrier diode according to an exemplary embodiment of the present invention.

Figure 6:
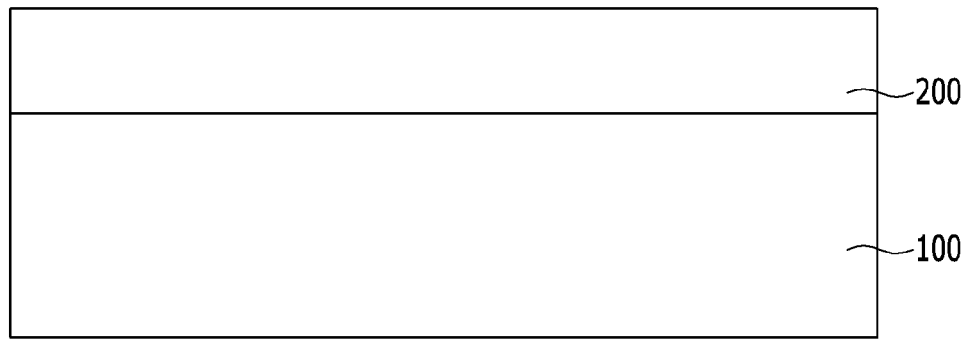
FIGS. 6 to 9 are diagrams sequentially illustrating a method of manufacturing a Schottky bather diode according to an exemplary embodiment of the present invention.

Referring to FIG. 6, an n+ type silicon carbide substrate 100 is prepared, and an n− type epitaxial layer 200 is formed on a first surface of the n+ type silicon carbide substrate 100 by epitaxial growth.

Figure 7:
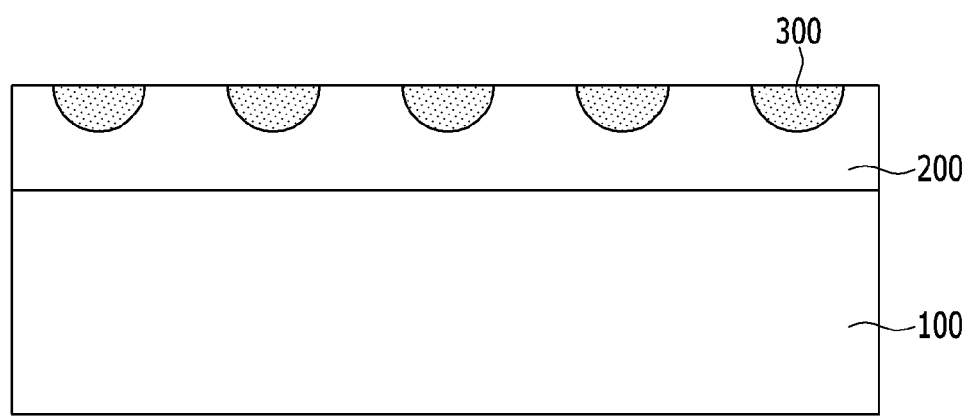

Referring to FIG. 7, a first p+ region 300 is formed by injecting p+ ions to a partial surface of the n-type epitaxial layer 200. The first p+ region 300 is formed in a lattice shape on the surface of the n− type epitaxial layer 200. As illustrated in FIG. 2, the first p+ region 300 includes a plurality of vertical portions 310, and horizontal portions 320 connecting both ends of the respective vertical portions 310. The vertical portions 310 include a plurality of first portions 311 having a hexagonal shape, a plurality of second portions 312 connecting the respective first portions 311, and a plurality of third portions 313 connecting the first portions 311 and the horizontal portions 320. The first portion 311 may be shaped like a hexagon, preferably, a regular hexagon, and a width of the first portion 311 is larger than a width of the second portion 312. The second portion 312 and the third portion 313 are shaped like a rod, and widths thereof are the same as each other.

Figure 8:
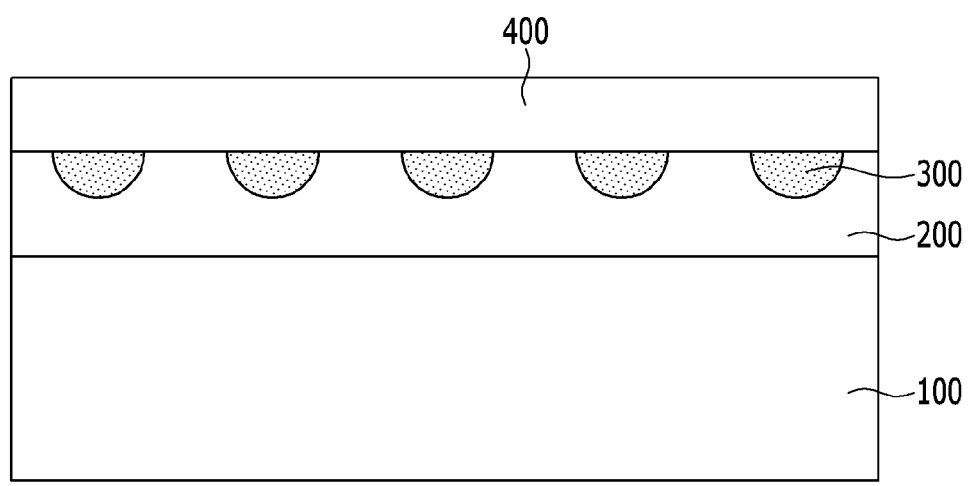

Referring to FIG. 8, an n type epitaxial layer 400 is formed on the n− type epitaxial layer 200 and the first p+ region 300 by epitaxial growth. In particular, a doping concentration of the n type epitaxial layer 400 is higher than a doping concentration of the n− type epitaxial layer 200.

Figure 9:
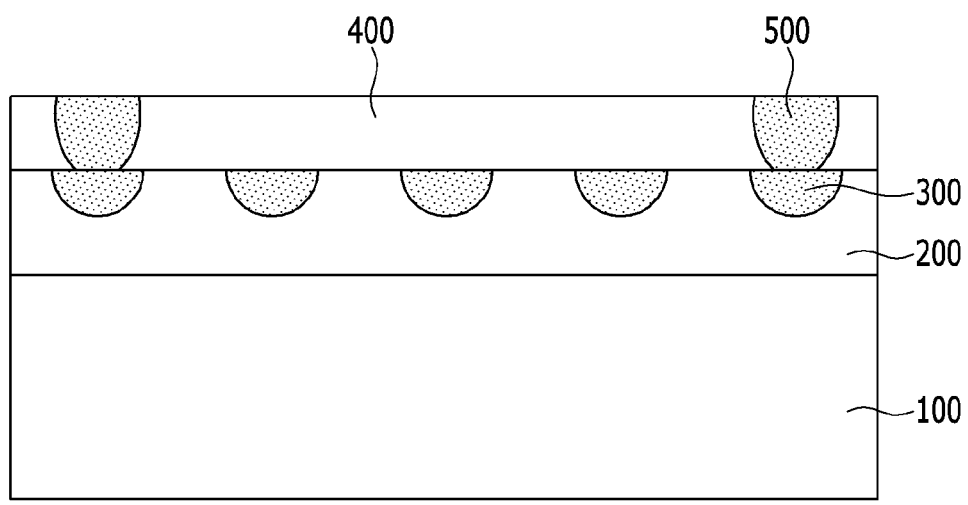

Referring to FIG. 9, a second p+ region 500 is formed by injecting p+ ions to a partial surface of the n type epitaxial layer 400. The second p+ region 500 is formed in a quadrangular shape. The second p+ region 500 is in contact with the horizontal portions 320 of the first p+ region 300 and the vertical portions 310 positioned at both ends among the plurality of vertical portions 310.

As illustrated in FIG. 1, a Schottky electrode 600 is formed on the n type epitaxial layer 400 and the second p+ region 500, and an ohmic electrode 700 is formed on the second surface of the n+ type silicon carbide substrate 100.

While this invention has been described in connection with what is presently considered to be practical exemplary embodiments, it is to be understood that the invention is not

What is claimed is:

1. A Schottky bather diode, comprising:
   an n– type epitaxial layer disposed on a first surface of an n+ type silicon carbide substrate;
   a first p+ region disposed on the n– type epitaxial layer;
   an n type epitaxial layer disposed on the n– type epitaxial layer and the first p+ region;
   a second p+ region disposed on the n type epitaxial layer, and being in contact with the first p+ region;
   a Schottky electrode disposed on the n type epitaxial layer and the second p+ region; and
   an ohmic electrode disposed on a second surface of the n+ silicon carbide substrate,
   wherein the first p+ region has a lattice shape including a plurality of vertical portions and horizontal portions connecting both ends of the respective vertical portions to each other,
   the vertical portions include a plurality of first portions shaped like a hexagon, a plurality of second portions connecting the respective first portions, and a plurality of third portions connecting the first portions and the plurality of the horizontal portions, and
   the second portions and the third portions are shaped like a rod.

2. The Schottky barrier diode of claim 1, wherein each first portion has a regular hexagonal shape.

3. The Schottky barrier diode of claim 2, wherein a width of each first portion is larger than a width of each second portion.

4. The Schottky barrier diode of claim 3, wherein the width of each second portion is the same as a width of each third portion.

5. The Schottky barrier diode of claim 4, wherein a horizontal line passing a center point of the first portion does not meet a horizontal line passing a center point of the first portion of the adjacent vertical portion.

6. The Schottky barrier diode of claim 1, wherein the second p+ region has a quadrangular shape.

7. The Schottky barrier diode of claim 6, wherein the second p+ region is in contact with the horizontal portion and the vertical portions positioned at both ends among the plurality of vertical portions.

8. The Schottky barrier diode of claim 1, wherein a doping concentration of the n type epitaxial layer is higher than a doping concentration of the n– type epitaxial layer.

9. A method of manufacturing a Schottky barrier diode, comprising:
   forming an n– type epitaxial layer on a first surface of an n+ type silicon carbide substrate;
   injecting p+ ions into a surface of the n– type epitaxial layer to form a first p+ region;
   forming an n type epitaxial layer on the n– type epitaxial layer and the first p+ region;
   injecting p+ ions into a surface of the n type epitaxial layer to form a second p+ region that is in contact with the first p+ region;
   forming a Schottky electrode on the n type epitaxial layer and the second p+ region; and
   forming an ohmic electrode on a second surface of the n+ type silicon carbide substrate,
   wherein the first p+ region has a lattice shape including a plurality of vertical portions and horizontal portions connecting both ends of the respective vertical portions to each other,
   the vertical portions include a plurality of first portions shaped like a hexagon, a plurality of second portions connecting the respective first portions, and a plurality of third portions connecting the first portions and the horizontal portions, and
   each second portion and each third portion are shaped like a rod.

10. The method of claim 9, wherein each first portion has a regular hexagonal shape.

11. The method of claim 10, wherein a width of each first portion is larger than a width of each second portion.

12. The method of claim 11, wherein the width of each second portion is the same as a width of each third portion.

13. The method of claim 12, wherein a horizontal line passing a center point of each first portion does not meet a horizontal line passing a center point of each first portion of the adjacent vertical portion.

14. The method of claim 9, wherein the second p+ region has a quadrangular shape.

15. The method of claim 14, wherein the second p+ region is in contact with the horizontal portion and the vertical portions positioned at both ends among the plurality of vertical portions.

16. The method of claim 9, wherein a doping concentration of the n type epitaxial layer is higher than a doping concentration of the n– type epitaxial layer.

* * * * *